United States Patent
Petersen

(10) Patent No.: US 10,942,582 B2
(45) Date of Patent: Mar. 9, 2021

(54) KEYBOARD LAYOUT

(71) Applicant: Victor Petersen, Lane Cove (AU)

(72) Inventor: Victor Petersen, Lane Cove (AU)

( * ) Notice: Subject to any disclaimer, the term of this patent is extended or adjusted under 35 U.S.C. 154(b) by 62 days.

(21) Appl. No.: 16/461,906

(22) PCT Filed: Nov. 20, 2017

(86) PCT No.: PCT/AU2017/051274
§ 371 (c)(1),
(2) Date: May 17, 2019

(87) PCT Pub. No.: WO2018/090103
PCT Pub. Date: May 24, 2018

(65) Prior Publication Data
US 2019/0332186 A1    Oct. 31, 2019

(30) Foreign Application Priority Data

Nov. 18, 2016 (AU) ................................. 2016904722

(51) Int. Cl.
*G06F 3/02*    (2006.01)

(52) U.S. Cl.
CPC .................................. *G06F 3/0219* (2013.01)

(58) Field of Classification Search
CPC .... G06F 3/0219; G06F 1/1662; G06F 3/0202; H03M 11/14
See application file for complete search history.

(56) References Cited

U.S. PATENT DOCUMENTS

| | | | | |
|---|---|---|---|---|
| 5,458,425 A | * | 10/1995 | Torok | B41J 5/10 400/486 |
| 8,858,102 B2 | * | 10/2014 | Jiang | G06F 3/0216 400/486 |
| 10,068,519 B2 | * | 9/2018 | Pham | G06F 3/0208 |
| 2005/0017955 A1 | * | 1/2005 | Jayachandra | G06F 3/018 345/171 |
| 2015/0212592 A1 | | 7/2015 | Molla et al. | |
| 2019/0332186 A1 | * | 10/2019 | Petersen | H03M 11/14 |

FOREIGN PATENT DOCUMENTS

| | | |
|---|---|---|
| EP | 1693736 A2 | 8/2006 |
| WO | 2005026931 A2 | 3/2005 |

OTHER PUBLICATIONS

International Search Report dated Mar. 5, 2018 from PCT Application No. PCT/AU2017/051274.

* cited by examiner

*Primary Examiner* — Dmitriy Bolotin
(74) *Attorney, Agent, or Firm* — Innovation Capital Law Group, LLP; Vic Lin

(57) ABSTRACT

There is provided herein an improved keyboard layout that has a particular alphabetical, numerical, functional and symbolic key layout that enhances keyboard layout compactness and hand specialisation. The symbolic key layout allows for the incorporation of a much larger symbol character set wherein more frequently used symbols are more readily accessible and more conveniently located. This particular layout may be overlaid with extended Latin and, in embodiments, Greek characters to facilitate typing of most Western European languages in ways which do not affect the symbol key layout, facilitates finding of extended characters and offers one-to-one key mappings between basic and extended symbols for each language.

33 Claims, 10 Drawing Sheets

KEYBOARD LAYOUT

FIELD OF THE INVENTION

This invention relates to an improved keyboard layout and related functionality.

BACKGROUND OF THE INVENTION

FIG. 1 shows the conventional "IBM style" keyboard, referred to herein as a standard keyboard layout. As can be seen, the standard keyboard is characterised in comprising a main typing area comprising three rows of alphabetical characters in traditional QWERTY layout. Symbol characters adjoin the alphabetical characters at the right-hand side thereof and function keys terminate, such as backspace, shift, enter keys and the like terminate the right hand side. The alphabetical keys and the symbol keys constitute 34 keys.

The numeric keypad is located on the right-hand side of the keyboard far to the right of the function keys for calculator-style input. These numbers are repeated across the top row of the typing area.

Directional navigation keys and further function keys may be located around the alphanumeric keys and overlay the numeric keypad.

The present invention seeks to provide an improved keyboard layout, which will overcome or substantially ameliorate at least some of the deficiencies of the prior art, or to at least provide an alternative.

It is to be understood that, if any prior art information is referred to herein, such reference does not constitute an admission that the information forms part of the common general knowledge in the art, in Australia or any other country.

SUMMARY OF THE DISCLOSURE

There is provided herein and improved keyboard layout that confers advantages including alphabetical, numeric, symbol, directional and functional key placement for enhanced layout compactness.

This layout further allows for alphabetical and numeric key hand specialisation.

Additionally, the symbol placement and the manner of usage thereof greatly increases the number of symbols available.

Furthermore, the symbols are placed in a way that is language invariant, thereby allowing the same symbol layout for differing languages.

This particular layout further allows for the placement of Latin characters that allows for the typing of most Western European extended Latin characters languages. As such, this layout can type languages used by well over 1 billion people in the world and almost all Western Europeans, meaning that it can be mass produced in a much larger quantity than any regional keyboard, reducing production and distribution costs for producers.

Additionally, the particular layout of the characters facilitates the finding of the extended Latin characters when typing.

Yet further, this same layout may further allow for typing of most if not all Latin script based languages and the Greek language by using a particular character mapping.

The character mapping may have a language specific key mapping for each language which allows a 1-to-1 key mapping between each extended character and associated basic character which may be selected using a selection key, thereby avoiding the use of dead keys, multiple key presses, autocorrect or other software related processes of the prior art.

Specifically, FIG. 2 shows an improved keyboard layout in accordance with a first embodiment.

The keyboard in accordance with this embodiment is characterised in that it comprises an alphabetical character zone and an adjacent numeric keypad arranged in a particularly compact form, thereby being suited for small form factor laptop, notebook devices and the like and reducing finger travel distance when typing, especially between alphabetical and numeric characters.

Furthermore, a function key zone is located to the right of the keypad such that all of the alphabetical, numeric and commonly used function keys are located closely together. Furthermore, such configuration allows handed typing specialisation wherein, for example, the left-hand may type the alphabetical characters while the other hand is occupied, such as holding a mouse, telephone or the like. Furthermore, the right-hand may specialise in numeric characters, being especially advantageous for accountants and software requiring extensive input of numbers.

The modification of the prior art keyboard layout to the present layout comprises increasing the number of keys within the alphabetical-symbolic typing region of the prior art keyboard from 34 keys (i.e. 26 alphabetical keys and 8 symbol keys) to 35 or 36 keys for the present alphanumeric typing zone of the present keyboard.

Such entails the introduction of an additional key to the right-hand side of the L character key, the transposition of the P character key from the top row to the bottom for and the relegation of the symbol keys from adjacent the alphabetical characters to a row above the alphanumeric typing zone.

In this way, the present keyboard comprises 35 or 36 keys arranged in a top, middle and bottom rows.

The top row comprises 12 keys beginning at the left-hand side thereof with alphabetical characters starting with the character Q and ending with the character O and ending at the right-hand side thereof with three numeric characters.

The middle row comprises 12 keys beginning at the left-hand side thereof with alphabetical characters starting with the character A in ending with the character L in any of the right-hand side thereof with three numeric character keys.

Furthermore, the bottom row comprises 11 or 12 keys beginning at the left-hand side thereof with alphabetical characters beginning with the character Z and ending with the character P and ending at the right-hand side thereof with three numeric character keys. In the embodiment where the third row comprises 11 keys, the number 0 may be located beneath the other numbers. Alternatively, the bottom row may comprise 12 keys wherein the number 0 is be located between the number 7 and the letter P.

As can be appreciated, this particular arrangement is a particularly space efficient placement of the alphabetical and numeric keys. Furthermore, this arrangement allows for a square ending of the numeric keypad at the right-hand side thereof making allowance for the touch typing of numbers which facilitates fast typing.

Furthermore, removing the symbol keys away from the alphanumeric typing zone to the top row is advantageous because current keyboard layouts are optimized to type symbols for a single or small range of languages. As such, the position and number of symbols on current keyboards is affected by the amount of letters in the target language. This means there is a wide range of location for symbols on different layouts.

Also, not all current keyboards have a complete range of symbols. As such, some symbols which are not found on a keyboard layout can only be input with the help of software which makes them application dependent.

This improved keyboard layout separates symbols and letters/numbers into separate rows. As such, the position of symbols does not change with regional version of this layout such that all layouts can type the same symbols.

Furthermore, this arrangement of symbols into discreet areas makes allowance for complete columns of function keys from top to bottom of the keyboard arrangement on both left and right hand sides of the keyboard thereof which facilitates typing.

Furthermore, the present arrangement allows for a wide range of symbols wherein each symbol key may comprise a quadrant of symbols which may be selected utilising either or a combination of shift & keypresses described in further detail below.

The symbols provided in the layout herein include all the symbols on a current standard keyboard plus common punctuation symbols that are used in Afrikaans, Albanian, Azerbaijani, Basque, Breton, Catalan, Czech, Danish, Dutch, English, Esperanto, Estonian, Finnish, French, German, Greek, Greenlandic, Hawaiian, Hungarian, Icelandic, Irish, Indonesian, Italian, Javanese, Kazakh, Kurdish, Latvian, Lithuanian, Maltese, Malaysian, Maori, Norwegian, Chinese Pinyin, Polish, Portuguese, Romanian, Sami (Northern), Samoan, Scots Gaelic, Serbo Croatian, Slovak, Slovene, Spanish, Swahili, Swedish, Tagalog, Tahitian, Tetum, Tongan, Turkish, Turkmen, Uzbek, Vietnamese, Welsh, Xhosa, Zulu, Chinese, Japanese and Korean. A number of symbols which are usually imputed through the use of software rather than direct typing may also be included.

As such, with the present layout, all these symbols are available for typing, irrespective of the language or application used and are furthermore always found in the same location.

The symbols may further be logically grouped and therefore easy to find and use despite their increased number. Since these symbols are all available on the keyboard, they are not application dependent and can be typed into all applications that enable typing.

Furthermore, in a preferred embodiment, the function keys of the function key zone are mirrored on adjacent sides of the alphanumeric typing zone. For current keyboard layouts, function keys such as esc (escape), delete left (backspace), delete right (delete), tab (tabulate), and enter (return) as well as sometimes alt (alternative), alt gr (alt graphics), ctrl (control), fn (function), Windows and menu occur only once each on the current standard keyboard layout. That makes it inconvenient to use when typing with one hand, such as when using a mouse.

The present function keys may comprise from top to bottom: esc, delete right, a delete left with tab as an alternative function, a return with tab as an alternative function, shift and control leys. Next to control may be a new selection key that functions in a way that is similar to the combination of alt gr, fn, Windows and menu, and then beside that an alt key. The new key enables the typing of alternative letters, symbols and functions on keys.

This layout makes it convenient to access all these function keys with either hand meaning that single handed typing is made easier. It also makes it possible to use the mouse with either hand while typing, enabling a two-mouse setup. Furthermore, the adjacent location of certain function keys reduces hand travel distance wherein, for example, the standard keyboard required significant hand travel between escape and enter keys, being especially problematic for software applications utilising these keys frequently, such as Microsoft Excel.

The present layout further allows for the typing of Western European languages. Specifically, most languages of Western Europe besides English use additional letters beyond the basic 26 Latin letters, however current keyboards do not enable all of these letters to be directly typed in a single layout.

For example, in order to type all the letters required for a multitude of languages, so that any word in those language can be typed, cumbersome steps such as changing keyboard layout, use of dead keys, autocorrect or other software related processes are necessary.

This makes the typing of multiple languages, such as French and German or Spanish, Swedish and Turkish much slower and more difficult than typing any single language.

Simply merging existing regional layouts to make a pan-regional layout is not possible because layouts are mutually exclusive with certain letters occurring on different keys in different layouts.

This improved keyboard layout places the letters ä, æ, á, â, å, à, ã, ç, é, ë, è, ê, ğ, í, ì, î, ı, i, ï, ı, ij, µ, ñ, ó, ò, õ, ö, ø, ô, œ, ş, ß, ú, ù, ü, û and ÿ that are used in Danish, Dutch, Finnish, French, German, Italian, Norwegian, Portuguese, Spanish, Swedish, Turkish and other languages together with the basic 26 letters and numbers 0 to 9 in the same single layout disclosed above as is shown in FIG. 3.

In accordance with this embodiment, the keyboard comprises a symbol key which is selectively operable to toggle the associated Latin character. For example, to type the character ä, the letter q would be press while the symbol character is held.

Over and above the utilisation of these additional characters, these characters are arranged in the keyboard in a particular way to facilitate speed typing. Specifically, the letters may be arranged such that letters cluster around the same basic letter, or a key that resembles that letter, as well as being organized into patterns such that all the letters with acutes are place on the same key as the original basic letter, all letters with diaresis are placed in the top row, all letters with graves in the middle row, and all letters with tildas in the bottom row, the letters are easy to find and type. Furthermore, the extended Latin characters may be arranged according to frequency wherein, for example, the character ÿ is marginalised given its infrequent use.

This enables all these languages as well as other languages such as English and Indonesian to be typed with a single keyboard layout, meaning that it is as fast to type any combination of these languages as it is to type any single one of these languages. This reduces typing costs for users and increases the quality of written communication.

Furthermore, FIG. 4 shows a yet further embodiment that allows for typing of a much wider range of Latin character and Greek languages.

Currently many languages have a specific regional keyboard layout that is mutually incompatible with other layouts. This makes it difficult for producers to supply keyboards in all layouts so some languages miss out on keyboards that conveniently type all the letters of their language in a convenient way.

This improved keyboard layout comprises a key mapping that places the letters ā, ą, ă, ǎ, č, ċ, ĉ, ć, d', đ, d, ə, ě, ę, ē, ė, ġ, ĝ, ǵ, ħ, ĥ, ỉ, ī, ĭ, ĵ, ƙ, l, ľ, !, ŧ, ň, ń, ŋ, ɲ, ơ, ō, ŏ, ǒ, ř, ŗ, ŕ, š, ş, ş, ţ, ť, ŧ, ʉ, ư, ū, ů, ű, ŭ, ū, [|$]$¨$$[|$]$¨Ahü, u, ù, ẃ, ẁ, ŵ, ẅ, Þ, ý, ỳ, ŷ, ž, ż, ź, α, β, γ, δ, ε, ζ, η, θ, ι, κ, λ, μ, ν, ξ, ο, π, ρ, ς, σ, τ, υ, φ, χ, ψ, ω, ά, έ, ή, ί, ό, ύ, ώ, ϊ, ϋ, ΐ and ΰ that are used to type Afrikaans, Albanian, Azerbaijani, Basque, Breton, Catalan, Czech, Danish, Dutch, English, Esperanto, Estonian, Finnish, French, German, Greek, Greenlandic, Hawaiian, Hungarian, Icelandic, Irish, Indonesian, Italian, Javanese, Kazakh, Kurdish, Latvian, Lithuanian, Maltese, Malaysian, Maori, Norwegian, Chinese Pinyin, Polish, Portuguese, Romanian, Sami (Northern), Samoan, Scots Gaelic, Serbo Croatian, Slovak, Slovene, Spanish, Swahili, Swedish, Tagalog, Tahitian, Tetum, Tongan, Turkish, Turkmen, Uzbek, Vietnamese, Welsh, Xhosa, Zulu and other languages together with the basic 26 letters and numbers 0 to 9 in a single layout. The appropriate characters from this key mapping may be selectively displayed according to a chosen language. Keyboard layouts for specific languages or groups of languages are comprised of a subset of letters of the character map.

In this regard, the key mapping locates the key characters such that most if not all of these languages can each be written without the instance of a single key being required to type two letters (unless these letters have no upper case version or have an upper and lower case relationship).

Furthermore, current standard keyboards are generally restricted in the number of glyphs they can type to those that have been programmed into the keyboard. This makes it technically difficult to add a new symbol or customize the layout. However, new glyphs are invented periodically and other glyphs rise and fall in popularity, making their inclusion or removal from the layout an issue, yet there is little that users can do to change the layout. Various users would benefit from typing specific glyphs but most will be unable to customize their keyboard to allow them to type them.

As such, the present layout may have a new key, the "hack" key, which if double clicked, opens a dialogue box as shown in FIG. 6 which allows the user to manage their keyboard on screen. This dialogue box displays installed languages 106, "hack packs" 107 and options 108. Single clicking of the "hack" key activates the selected "hack pack". This disables the number and direction key functions and these keys instead type the customized glyphs of the "hack pack". Through this process, the keyboard layout is infinitely customizable.

This allows users to select customization that suits their needs and wants and for the keyboard layout to be easily supplemented when necessary.

Now, with regards of the prior art, EP 1693736 A2 (HIGH TECH COMPUTER CORP. (TW)) 23 Aug. 2006 [hereinafter referred to as D1] discloses a keyboard directed to the problem of alphabetical key space efficiency for small form factor personal digital assistant (PDA) keyboards.

As such, D1 proposes various key arrangements for optimising the space for the alphabetical characters that essentially entails truncating the longest top typing row by placing the P key elsewhere, such as above the letter O (see FIGS. 2A-C) below the letter L (see FIG. 3B).

However, D1 is not directed to keyboard optimisation compactness for both alphabetical and numerical keys and, to the extent that it does comprise numeric keys, D1 teaches the superimposition of the numerical keys atop the alphabetical keys which teaches away from the present solution.

It cannot necessarily be said that a light of the teaching of D1 that the skilled person would have tried the claimed layout of 35 key comprising three rows respectively comprising 12 keys, 12 keys and 11/12 keys, each starting with alphabetical keys, terminating with three numeric keys and having function keys to the right thereof, let alone the addition of an extra key adjacent the L character key or the positioning of the symbols across and atop the top row. With regard to the latter, whereas FIG. 2B of D1 shows a top symbol key row, such is shown adjacent the P key which teaches away from the present layout and, furthermore, where D1 does show the P key terminating the bottom row in FIG. 3A, a quasi-function/symbol key row is shown below the bottom row, again teaching away from the claimed solution).

There is no motivation from D1 for the skilled person to adopt the present layout. Specifically, D1 is silent on the problems of hand specialisation, symbol key language-independent placement, let alone configurations allowing for the typing of Western European languages.

Other aspects of the invention are also disclosed.

BRIEF DESCRIPTION OF THE DRAWINGS

Notwithstanding any other forms which may fall within the scope of the present invention, preferred embodiments of the disclosure will now be described, by way of example only, with reference to the accompanying drawings in which.

DESCRIPTION OF EMBODIMENTS

Figure 1:
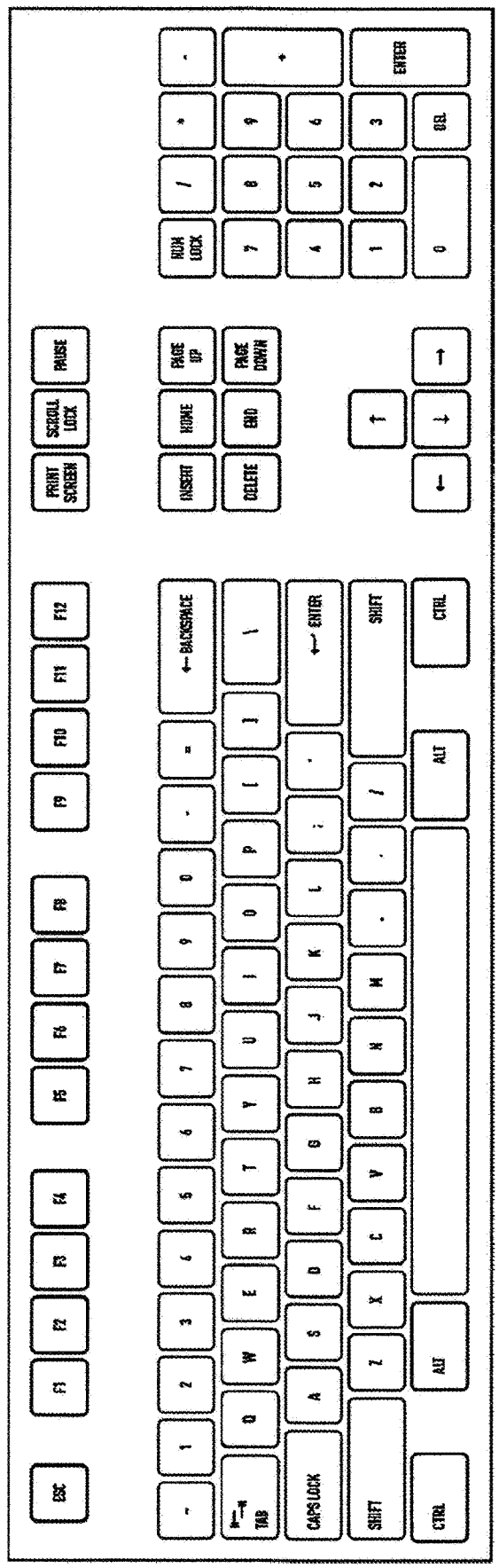
FIG. 1 shows a standard keyboard layout of the prior art.
Figure 2:
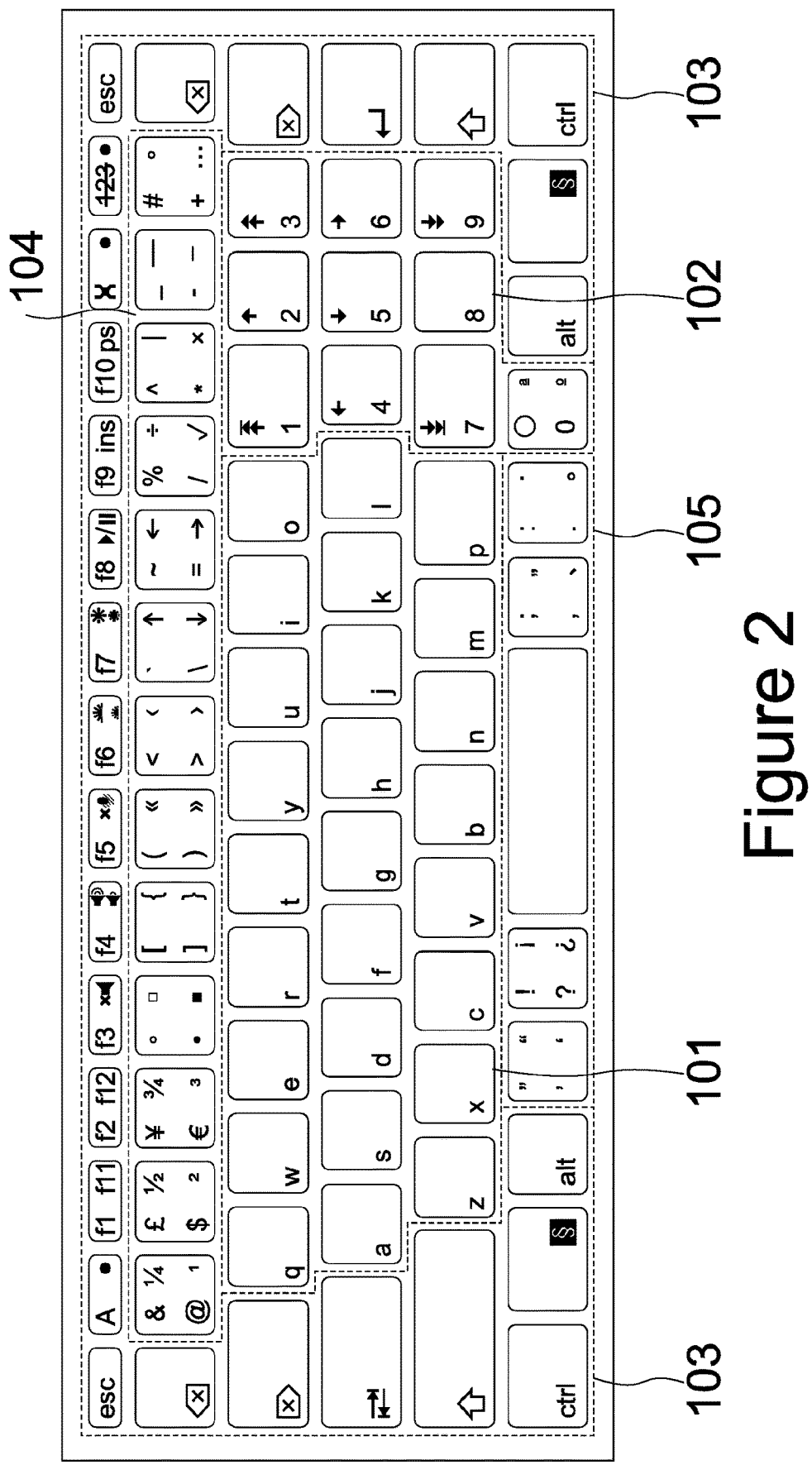
FIG. 2 shows an improved keyboard layout in accordance with an embodiment.

FIG. 2 shows a keyboard layout. The layout comprises 35 or 36 alphanumeric keys arranged to define a left-hand side alphabetical character typing zone 101 and a right hand side numeric keypad 102 which comprise top, middle and bottom rows.

The top row comprises 12 keys beginning at the left-hand side thereof with alphabetical character starting with the character Q and ending with the character O and ending at the right hand side thereof with three numeric characters.

A middle row similarly comprises 12 keys beginning at the left-hand side thereof with alphabetical character starting with the character A and ending with the character L and ending at the right hand side thereof with three numeric character keys.

The bottom row may comprise 11 or 12 keys beginning at the left-hand side thereof with alphabetical character is beginning with the character Z and ending with the character P and ending at the right hand side thereof with three numeric character keys. For the embodiment wherein the bottom row comprises 11 keys, the 0 number key may be located beneath the 7 number key. Where the bottom row comprises 12 keys, the 0 the key may be located between the P character and 7 number keys.

A row of symbol keys 104 are arranged above the top row of alphanumeric keys.

A row of symbol and punctuation keys 105 may be arranged below the bottom row of alphanumeric keys.

Furthermore, a function keys zone 103 is located to the right of the numeric keypad 102. The function keys zone 103 may also extend around the periphery above the row of symbol keys 104 and to the left of the alphabetical character typing zone 101. Symbol and punctuation keys 105 may also be located under the bottom typing row.

The various zones of the keyboard, alphabetical character typing zone 101, the numeric keypad 102, the function keys zone 103, the symbol keys 104, and the symbol and punctuation keys 105 may each be coloured a different colour to indicate the various functional roles for each zone.

To the right of the space bar may be a comma and full stop. These punctuation symbols are positioned between the numbers and letters and are often used when writing both letters and numbers. To the left of the space bar and further away from the numbers may be the question mark and apostrophe. These punctuation symbols are generally used when writing letters, and less frequently with numbers. In a specific embodiment shown, the symbols adjoining the space bar contain", ', ", ', !, ?, ¡, ¿, space, :, ,, ,,, ҆, :, ., •, ○ ○, ª and º. Variants may contains the symbols . . . , -, / and \ which may be grouped onto keys in the following way: ", '," and '; !, ?, ¡ and ¿; space; :, ,, ,, and ҆ ; :, ., •○, 0, ○, ª and º; and . . . , -, /and \.

Each of the basic punctuation symbols of full stop, comma, question mark and apostrophe may be paired with another related symbol, so that full stop goes with colon, comma with semi-colon, question mark with exclamation mark and apostrophe with double quote mark.

Each key may also have additional symbols that are generally used in languages other than English. For example, the full stop may also be paired with the ideographic period sign and centre dot. The comma may be paired with the ideographic comma and German quote mark. The question mark and exclamation mark may be paired with the Spanish inverted question mark and inverted exclamation mark. The apostrophe and quote mark may be paired with the opening versions of the two. Furthermore, 0 may be paired with the ideographic number zero and ordinal indicators. Additional common punctuation comprising ellipsis, dash, back slash and forward slash may be put together on one key.

The symbol key row 104 may comprise symbol keys that contain &, @, ¼, ¹, £, $, ½, ², ¥, €, ¾, ³, ○, •, □, ■, [,], {, }, (, ), «, », <, >, ‹, ›, ҆, \, ↑, ↓, ~, =, ←, →, %, /, ÷, √, ˆ, *, |, ×, _, -, —, -, #, +, º and . . . .

These may be been grouped onto single key quadrant comprising &, @, ¼ and ¹; £, $, ½ and ²; ¥, €, ¾ and ³; ○, •, □ and ■; [,], {and}; (, ), « and »; <, >, ‹ and ›, ҆, \, ↑ and ↓; ~, =, ← and →; %, /, ÷ and √; ˆ, *, | and ×; _, -, — and -; #, +, º and . . . .

The arithmetic function symbols +, −, *, / and = may be arranged in a row from right to left and placed directly above the numbers. The telephone symbols * and # may be placed in a similar position to a phone but above the numbers rather than below.

The line symbols, _, -, — and - may be grouped on one key with | next to them. Tick and cross may be on adjacent keys. The key with * may also have the × symbol on it, while the key with / may also have ÷.

In mathematical terms, *, × and ˆ all relate to increasing the size of a number by a multiple number of times. As such, these symbols are all put on the one key. Similarly %, /, ÷ and √ all relate to decreasing the size of a number by a certain amount and these may also occur together on one key.

Furthermore, the %, / and √ are grouped as they slope one direction, and similarly, ҆, and \ slope in the other direction. Furthermore, = and ~ do not slope and both can refer to types of equivalence.

Arrows may be grouped together on two keys. Bracket-like symbols may be grouped together with the opening version at the top and closing version at the bottom of the same key.

Bullet point-like symbols may be located on one key. Currencies may be grouped together as are fractions and superscript numbers. The symbols @ and & may be grouped together. @ may be the first symbol of the keyboard making it easy to find and type since this key is very important to internet use.

In a preferred embodiment, the function keys of the function zone 103 are mirrored in adjacent sides of the keyboard. Function keys may comprise from top to bottom, escape (esc), delete left (backspace), delete right (delete) a delete left with tab (tabulate) as an alternative function, enter (return) with tab (tabulate) as an alternative function, shift and ctrl (control), while next of ctrl is a new selection key 105 for alternative character and function selections, and next to that alt (alternative). Running between the two esc buttons may be caps lock 113, the function keys F1 to F10, a new "hack" key 114, and a new "numbers off" key 115.

Figure 3:
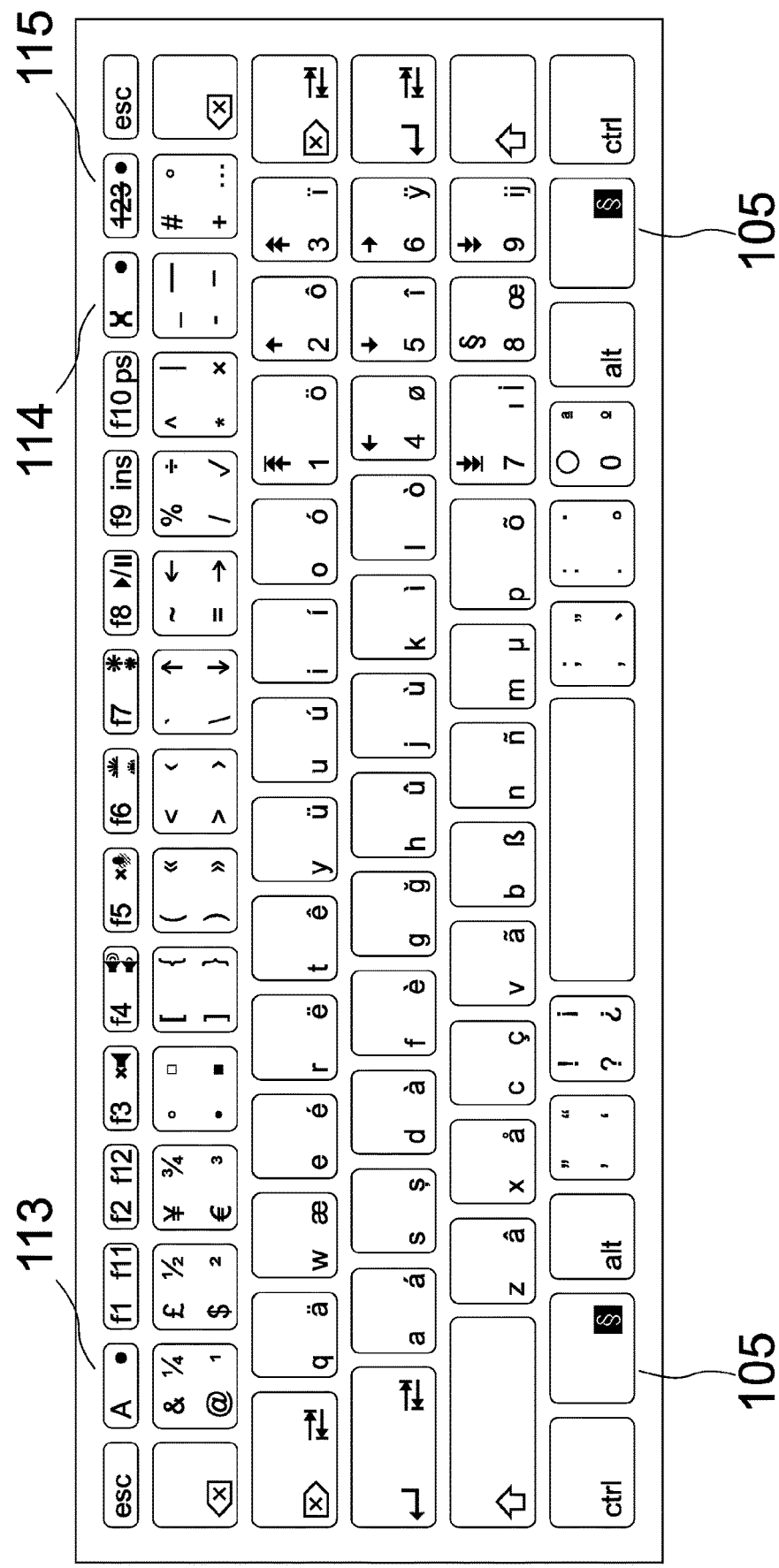
FIG. 3 shows the layout of FIG. 2 comprising additional Latin characters for the typing of Western European languages.

FIG. 3 shows a further embodiment wherein extended Latin characters are mapped onto their corresponding basic character counterpart keys.

These additional characters may comprise letters and letters with diacritics including ä, œ, á, â, å, à, ã, ç, é, ë, è, ê, ğ, í, ì, ı, i, ï, î, ij, μ, ñ, ó, ò, õ, ö, ø, ô, æ, ş, ß, ú, ù, ü, û and ÿ, paired with the standard 26 letters of the English alphabet and the numbers 1 to 9.

There is shown the specific parings of a preferred embodiment of the pairing of q with ä, w with æ, e with é, r with ë, t with ê, y with ü, u with ú, i with í, o with ó, 1 with ö, 2 with ô, 3 with ï, a with á, s with ş, d with à, f with è, g with ğ, h with û, j with ù, k with ì, l with ò, 4 with ø, 5 with î, 6 with ÿ, z with â, x with å, c with ç, v with ã, b with ß, n with ñ, m with μ, p with õ, 7 with ı and i, 8 with œ and § and 9 with ij.

Figure 4:
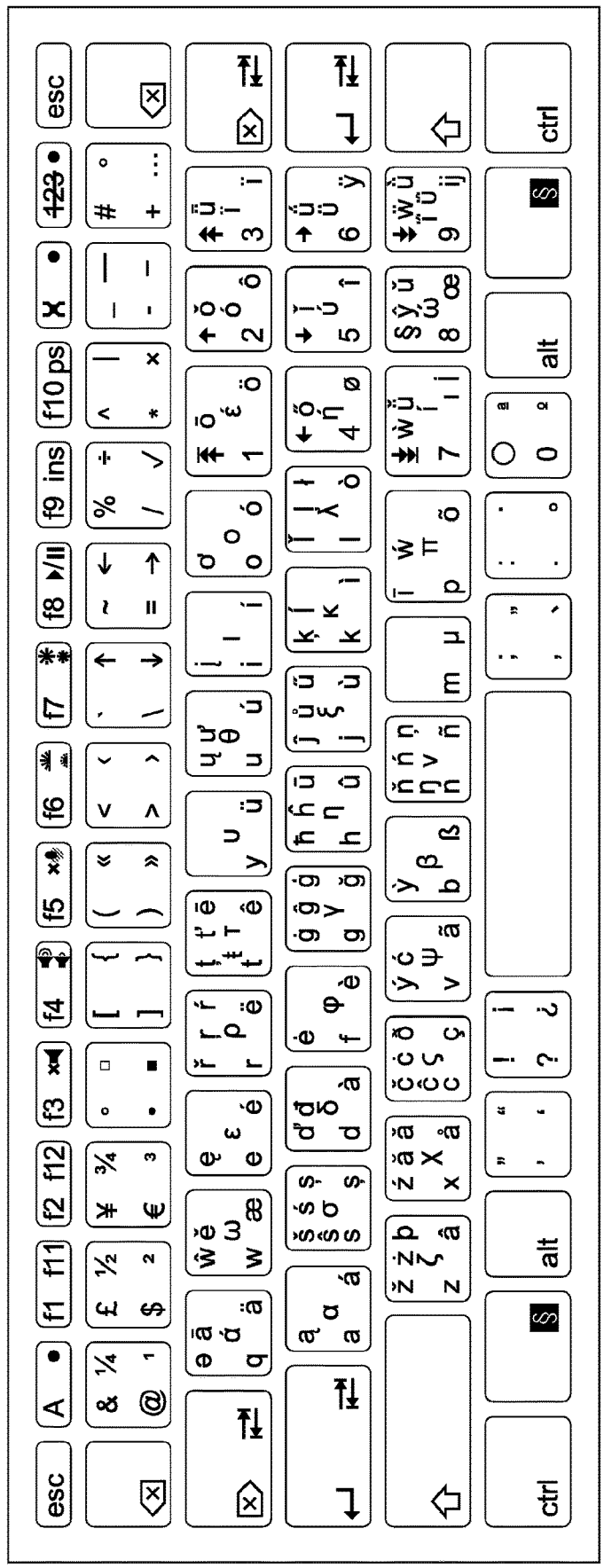
FIG. 4 shows the layout of FIG. 2 comprising yet further additional languages for typing a much wider range of Latin character and Greek languages.

FIG. 4 shows the arrangements of the 36 glyph keys with the letters and letters with diacritics ā, ą, ă, ǎ, č, ċ, ĉ, ć, d', đ, ḍ, ə, ĕ, ę, ē, ė, ġ, ĝ, ģ, ħ, ĥ, i, ī, ı̄, ị, ȷ, ᴋ, ḷ, l', ŀ, ɬ, ň, ń, ṇ, ŋ, ơ, ō, ŏ, ö, ř, ŗ, ŕ, š, ś, ŝ, ţ, t', ŧ, ч, u', ū, ů, ű, ŭ, ū, ụ, [|$]$˝$$[|$]$˝ Ahü, u, ŵ, ẃ, ẁ, ẅ, Þ, ý, ỳ, ŷ, ž, ż, ź, α, β, γ, δ, ε, ζ, η, θ, ι, κ, λ, μ, ν, ξ, ο, π, ρ, ς, σ, τ, υ, φ, χ, ψ, ω, ά, έ, ή, ί, ό, ύ, ώ, ϊ, ϋ, ϊ̈ and ϋ̈ paired with the standard 26 letters of the English alphabet and the numbers 1 to 9.

It shows the specific parings of q with ä, ə, ā and ά, w with æ, ŵ, ĕ and ω, e with é, ę and ε, r with ë, ř, ŗ, ŕ and ρ, t with ê, ē, ţ, t', ŧ and τ, y with ü and υ, u with ú, ч, u' and θ, i with í, ị and ι, o with ó, o' and Greek letter o, 1 with ö, ō and ḗ, 2 with ô, ŏ and Greek letter ó, 3 with ï, ū and Greek letter ì, a with á, ą and α, s with ʂ, š, ś, ŝ and σ, d with à, d', đ and ð, f with è, ė and ϕ, g with ğ, ġ, ĝ, ǵ and γ, h with û, ū, ħ, ĥ and η, j with ù, ĵ, ů, ű and ξ, k with ì, ᵏ, l and κ, l with ò, ḷ, ᶦ, ł and λ, 4 with ø, ő and ṅ, 5 with î, ĭ and ʊ, 6 with ÿ, ü and ů, z with â, ž, ż, þ and ζ, x with å, ź, ă, ǎ and χ, c with ç, č, ċ, ĉ, d and ʕ, v with ã, ý, ć and ψ, b with ß, ỳ and β, n with ñ, ň, ń, ᴺ, ŋ and Greek letter ν, m with μ, p with õ, ī, ẁ and π, 7 with ᶦ, i, ẇ, ü and Greek letter ι, 8 with œ, ŷ, ǔ, § and ω, and 9 with ij, ẅ, ủ, ẗ and ü.

Figure 5:
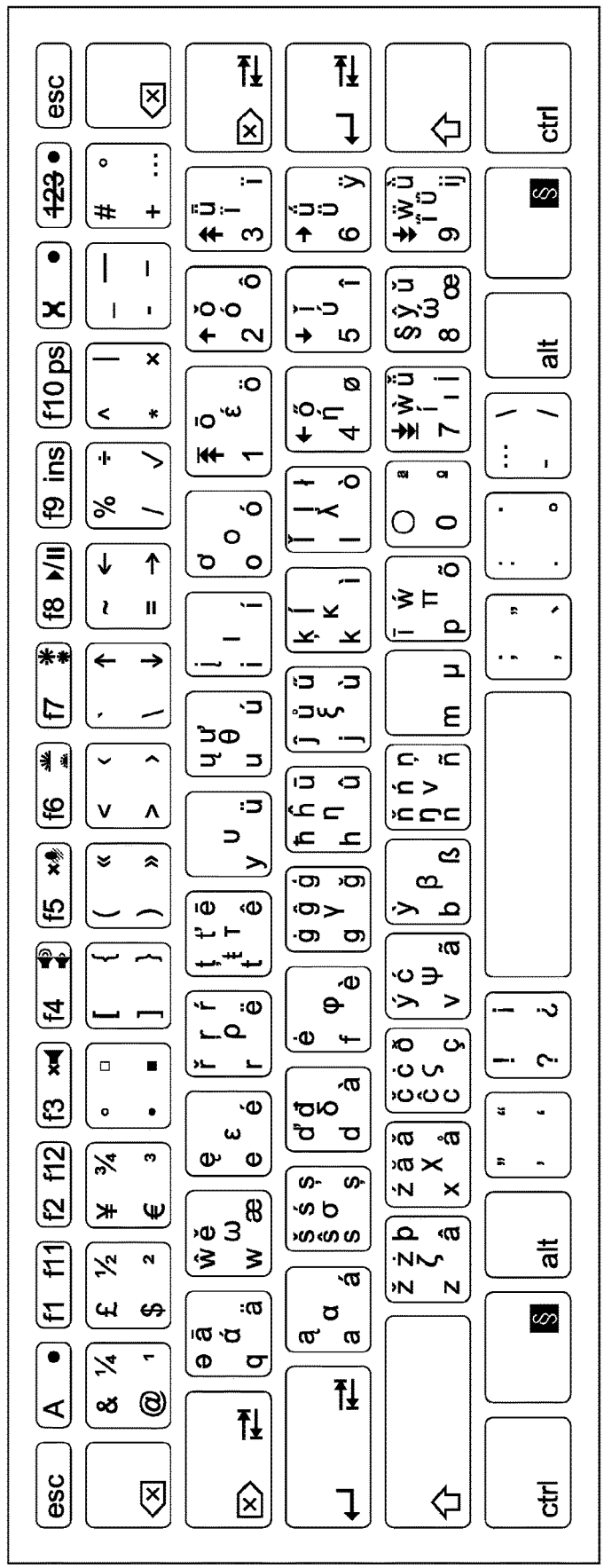
FIG. 5 shows an alternative layout to FIG. 4 wherein the zero key is placed on the bottom row of alphanumeric keys.

FIG. 5 shows the alternative arrangement from FIG. 4 of the 36 glyph keys with the letters and letters with diacritics ā, ą, ă, ǎ, č, ċ, ĉ, ć, d', đ, ḍ, ә, ě, ę, ē, ė, ġ, ĝ, ǵ, ħ, ĥ, ı, ī, ì, ĵ, ᵏ, ł, l', ᶦ, ł, ň, ń, ᴺ, ᴺ, ơ, ō, ő, ö, ř, ŕ, ŗ, š, ś, ŝ, ţ, t', ť, ʮ, u', ū, û, ů, ŭ, ű, ủ, [|$]$"$$[|$]$"Ahü, ủ, ẅ, ẃ, ẁ, ẅ, þ, ý, ỳ, ŷ, ž, ż, ź, α,β, γ, δ, ε, ζ, η, θ, ι, κ, λ, μ, ν, ξ, ο, π, ρ, ς, σ, τ, υ, φ, χ, ψ, ω, ά, έ, ή, ί, ό, ύ, ώ, ι, ϋ, ẗ and ü paired with the standard 26 letters of the English alphabet and the numbers 1 to 9.

Figure 6:
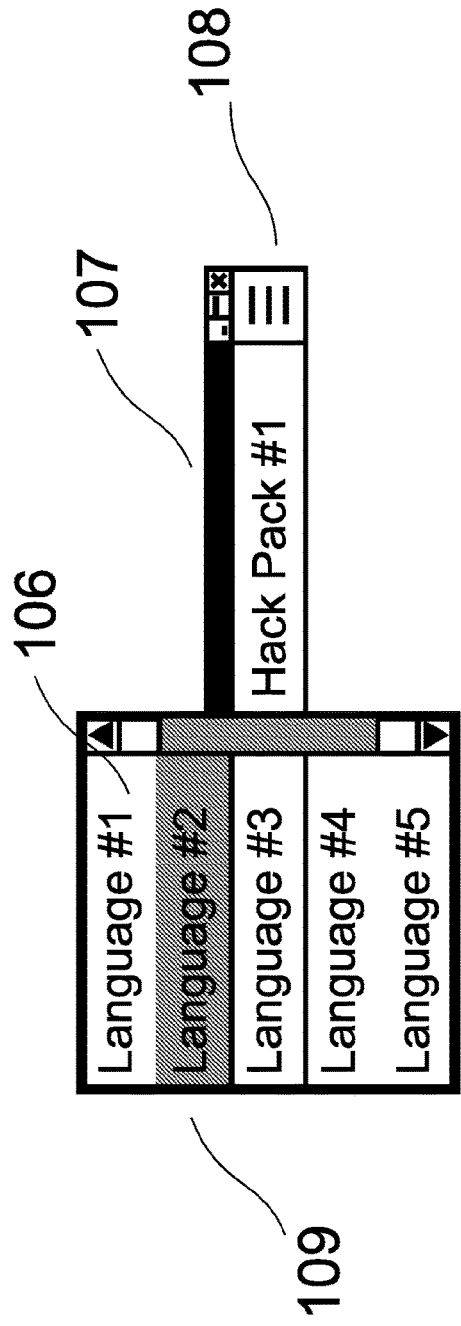
FIG. 6 shows the utilisation of the "hack" key to modify the layout of the keyboard, including is as exemplified in FIGS. 7 and 8.

FIG. 6 shows the dialogue box that is displayed on screen when the hack key is double pressed or long pressed. It has three sections: language packs 106, hack packs 107 and options 108. The language packs 106 show, when active, the languages that have been installed. Primary languages 109 may be highlighted. The selected language may be framed in the middle of the dialogue box.

Figure 8:
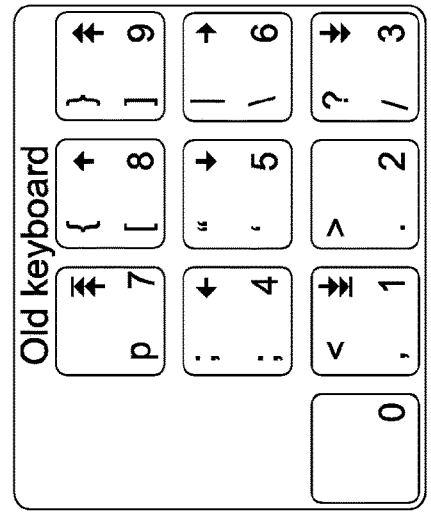
Figure 7:
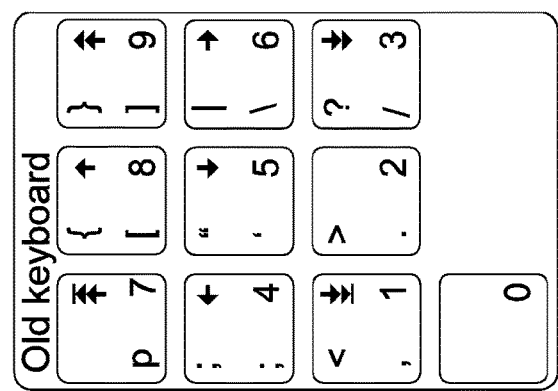

FIGS. 7 and 8 show examples of hack packs. The hack pack has a name and a layout of glyphs or other things that are typed or activated when pressed. The name of the hack pack corresponds to the name in the list of hack packs. The hack pack is activated by first making it the selected hack pack in the dialogue box, then single clicking the hack key. When active, the usual actions of the number keys are suspended and instead each key types according to the hack pack.

Figure 10:
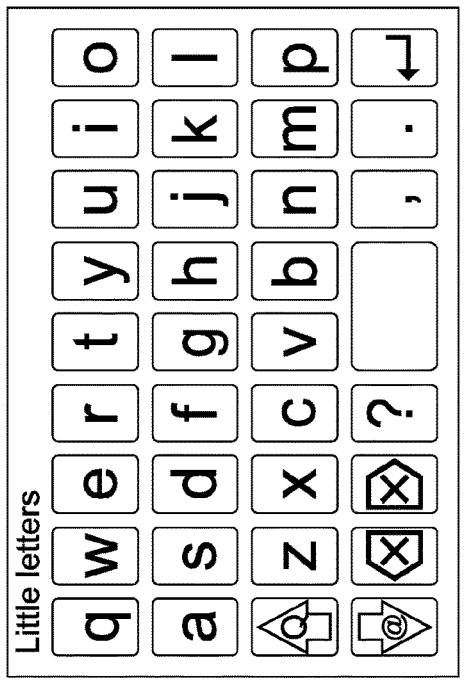
FIGS. 9-17 show the present layout principles applied to small form factor screen layouts, such as for mobile phones.
Figure 9:
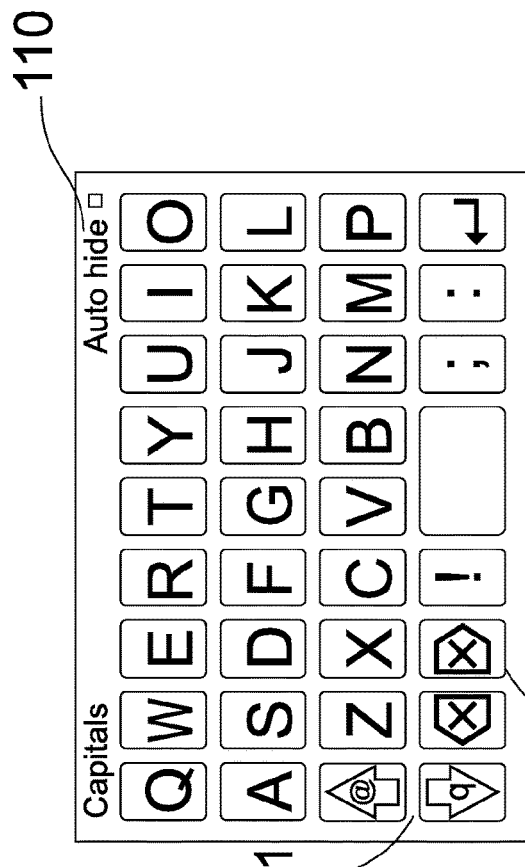
Figure 11:
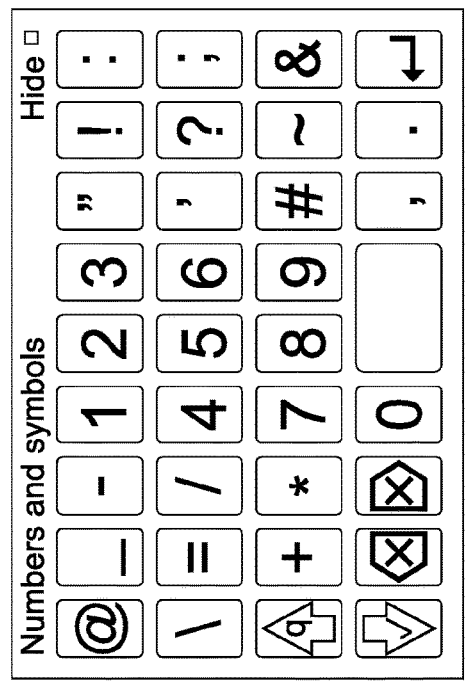

FIGS. 9 to 11 show the various components of the layout of the keyboard for small devices such as phones and tablets. Each screen is a standard layout, 9 keys wide and 4 keys tall, with two keys merged into one on the bottom row to form the space key. Each screen has a heading that enables it to be listed in a list of installed screens.

The screen may have a choice 110 to hide the screen, which if selected, requires the double clicking of the screen up or screen down keys 111 to reveal it. The screen has a layout for glyphs, screen up or screen down keys 111, delete left and delete right keys 112, space bar and an enter key. The screen up and screen down keys 111 may display the top right glyph of the screen that they will move to if pressed.

Figure 13:
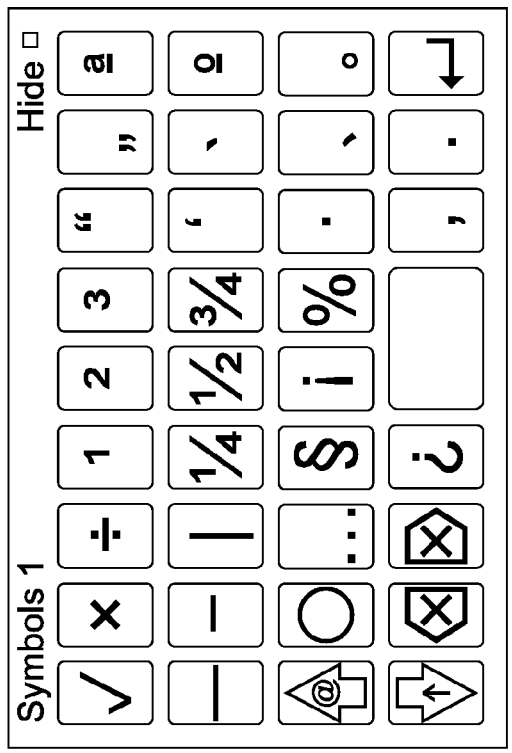
Figure 12:
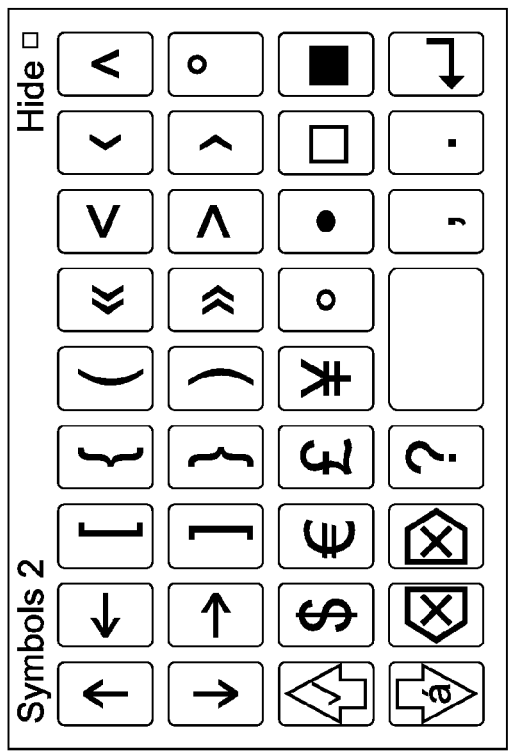
Figure 15:
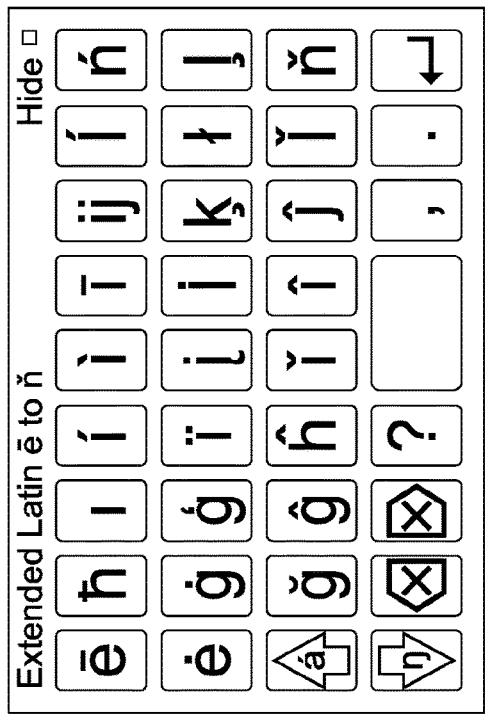
Figure 17:
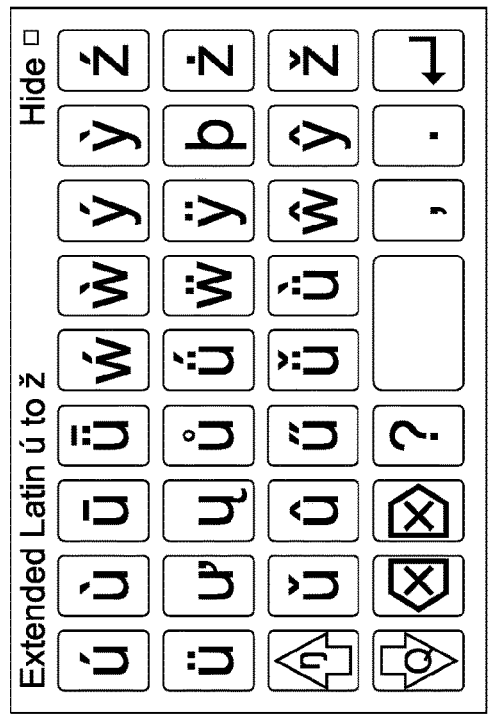
Figure 14:
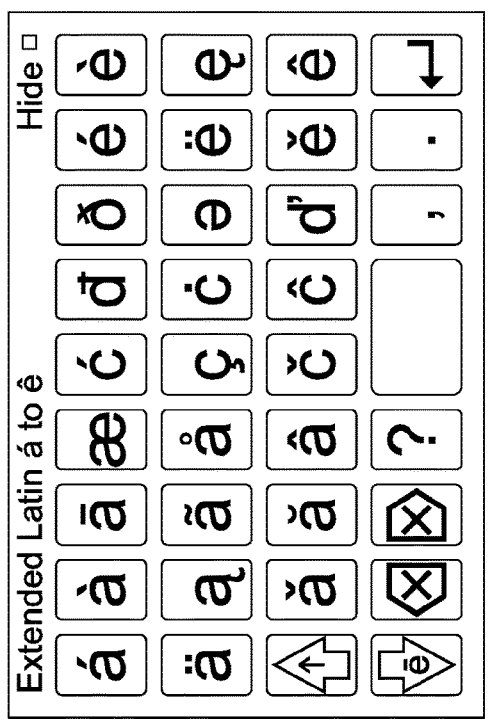
Figure 16:
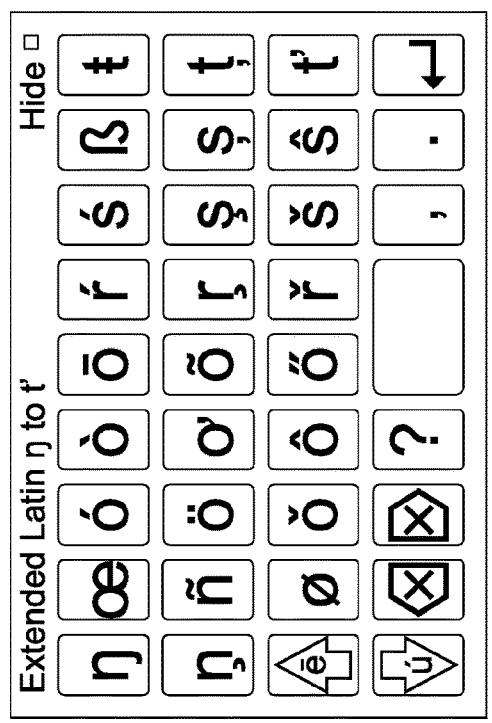
Figure 18:
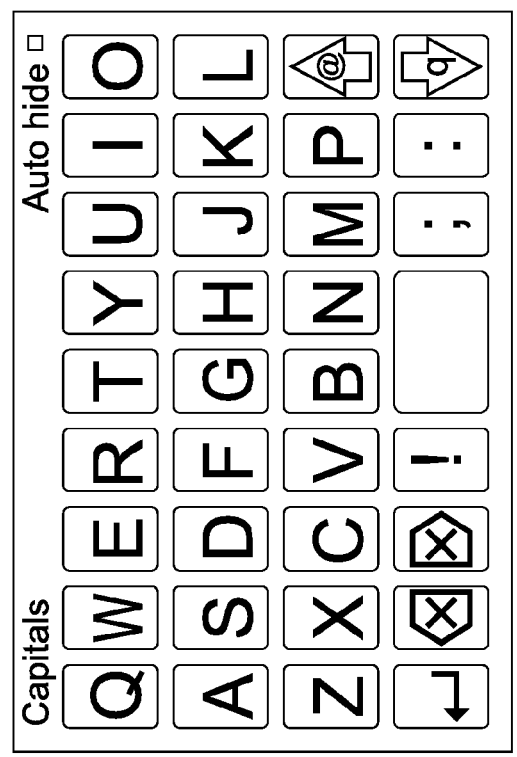
FIG. 18 shows an alternative layout to FIG. 9 wherein the return key and screen up and down keys are transposed, and the bottom row of alphanumeric and symbol keys is shifted one position to the left.

FIGS. 9 to 10 show the layout for the basic letters screens. FIG. 9 shows the auto hide button 110 which if selected, causes the little letter screen to appear once one option has been chosen from the capitals screen. FIG. 11 show the layout of the numbers and symbols screen. This screen contains all numbers, common punctuation and common internet symbols. FIGS. 12 and 13 show the layout of the symbols screens. FIGS. 14 to 17 show the layout of the extended Latin screen. FIG. 18 shows an alternative layout to FIG. 9 an alternative layout to FIG. 9 wherein the return key and screen up and down keys are transposed, and the bottom row of alphanumeric and symbol keys is shifted one position to the left.

These letters may be arranged according to a clear and repetitive pattern so that, despite there being 104 letters, equal to four times the standard English alphabet of 26 letters, they can be easily located.

The letters may be arranged in broad alphabetical order from left to right. They are also divided into rows by diacritic such that letters with acutes, graves, macrons and strokes as well as ligatures are generally in the top row; letters with diaresis, ogoneks, horns, cedillas, tildas, rings, dots and commas below are generally in the middle row; letters with carons, circumflexes, breves and double graves are generally in the bottom row and within a row, and there is a regular pattern among diacritics so that acutes come before graves which come before macrons, diaresis comes before ogoneks which come before tildas which come before rings, and carons come before circumflexes which come before double graves.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

The invention claimed is:

1. An improved keyboard layout comprising:
   at least 36 alphanumeric keys arranged to define a left-hand side alphabetical character typing zone and a right-hand side numeric keypad;
   a top row comprising 12 keys beginning at the left-hand side thereof with alphabetical characters starting with character Q and ending with character O and ending at the right-hand side thereof with three numeric characters;
   a middle row comprising 12 keys beginning at the left-hand side thereof with alphabetical characters starting with character A and ending with character L and ending at the right-hand side thereof with three numeric character keys;
   a bottom row comprising at least 11 keys beginning at the left-hand side thereof with alphabetical characters beginning with character Z and ending with character P and ending at the right-hand side thereof with at least three numeric character keys;
   a row of symbol keys arranged above the top row; and
   a right-hand side function key zone to the right of the numeric keypad comprising three function keys corresponding to each row.

2. The layout as claimed in claim 1, wherein the three function keys comprise backspace, enter and shift.

3. The layout as claimed in claim 1, wherein the bottom row comprises 12 keys comprising 0 between P and 7.

4. The layout as claimed in claim 1, further comprising a lower function row beneath the bottom row comprising a space bar and a comma and full stop to the right of the space bar.

5. The layout as claimed in claim 4, further comprising question mark and apostrophe to the left of the space bar.

6. The layout as claimed in claim 5, further comprising the symbol ", ',", ', !, ?, ¡, ¿ to the left of the space bar.

7. The layout as claimed in claim 5, further comprising two keys to the left of the space bar comprising character groupings comprising ", ',", and '; !, ?, ¡ and ¿.

8. The layout as claimed in claim 5, further comprising , ;, „, ‚‚‚ ` , :, ., ' ○ to the right of the space bar.

9. The layout as claimed in claim 8, further comprising two keys to the right of the space bar comprising character groupings comprising , ;, „, ‚‚‚ ` , and :, ., ' ○.

10. The layout as claimed in claim 1, wherein at least a subset of the symbol keys comprise a quadrant of symbols comprising a default symbol and three selectable symbols.

11. The layout as claimed in claim 10, wherein the selectable symbols comprises a first selectable symbol accessible by a press of a first key, a second selectable symbol accessible by oppressive a second key and third selectable symbol accessible by a press of the first and second keys.

12. The layout as claimed in claim 11, wherein the default symbol is selected according to use frequency.

13. The layout as claimed in claim 11, wherein the default symbols are arranged from left to right according to use frequency.

14. The layout as claimed in claim 10, wherein the symbol keys comprise &, @, ¼, ¹, £, $, ½, ², ¥, €, ¾, ³, ○, •, □, ■, [, ], {, }, (, ), «, », <, >, ‹, ›, ´, `, \, ↑, ↓, ~, =, ←, →, %, /, ÷, √, ^, *, |, ×, _, -, —, -, #, +, ° and . . . .

15. The layout as claimed in claim 10, wherein the symbol keys are grouped into quadrants comprising at least one of:
&, @, ¼, ¹;
£, $, ½, ²;
¥, €, ¾, ³;
○, •, □, ■;
[, ], {, };
(, ), «, »;
<, >, ‹, ›;
´, `, \, ↑ and ↓;
~, =, ←, →;
%, /, ÷, √;
^, *, |, ×;
_, -, —, -; and
, +, °, . . . .

16. The layout as claimed in claim 10, wherein the symbol keys comprise arithmetic function symbols +, −, *, / and = in a row from right to left.

17. The layout as claimed in claim 10, wherein arithmetic function symbols are placed directly above the numbers.

18. The layout as claimed in claim 10, wherein telephone symbols * and # are placed above the numeric keypad.

19. The layout as claimed in claim 10, wherein *, × and ^ are located on one key.

20. The layout as claimed in claim 10, wherein %, /, ÷ and √ are located on one key.

21. The layout as claimed in claim 1, further comprising selectable extended Latin characters ä, æ, á, â, å, à, ã, ç, é, ë, è, ê, ğ, í, ì, i, İ, ï, î, ij, µ, ñ, ó, ò, õ, ö, ø, ô, œ, ş, ß, ú, ù, ü, û and ÿ assigned to the alphanumeric keys.

22. The layout as claimed in claim 21, wherein the layout comprises a selection key for selection of an extended Latin character.

23. The layout as claimed in claim 22, wherein the extended Latin characters are clustered according to letter type.

24. The layout as claimed in claim 22, wherein the extended Latin characters are clustered according to diacritic type.

25. The layout as claimed in claim 22, wherein the extended Latin characters are arranged according to frequency use type.

26. The layout as claimed in claim 21, wherein the selectable extended Latin characters are paired according to at least one of:
q with ä, w with æ, e with é, r with ë, t with ê, y with ü, u with ú, i with í, o with ó, 1 with ö, 2 with ô, 3 with ï, a with á, s with ş, d with à, f with è, g with ğ, h with û, j with ù, k with ì, 1 with ò, 4 with ø, 5 with î, 6 with ÿ, z with â, x with å, c with ç, v with ã, b with ß, n with ñ, m with µ, p with õ, 7 with ı and İ, 8 with œ and §, and 9 with ij.

27. The layout as claimed in claim 1, further comprising further extended Latin and Greek characters ā, ą, ă, ǎ, č, ċ, ĉ, ć, d', đ, ḍ, ə, ě, ę, ē, ė, ġ, ĝ, ǵ, ħ, ĥ, ị, ī, ĭ, ĵ, ķ, ł, l', ļ, ḷ, ň, ń, ŋ, ŋ, o', ō, ő, ǒ, ř, ŗ, ŕ, š, ś, ŝ, ţ, t', ṭ, ų, u', ū, ů, ű, ŭ, ṵ, ṳ, [|$]$¨$$[|$]$¨Ahü, ŭ, ŵ, ẃ, ẁ, ẅ, ṯ, ý, ỳ, ŷ, ž, ż, ź, α, β, γ, δ, ε, ζ, η, θ, ι, κ, λ, µ, ν, ξ, ο, π, ρ, ς, σ, τ, υ, φ, χ, ψ, ω, ά, έ, ή, ί, ό, ύ, ώ, ϊ, ϋ, ΐ and ΰ assigned to the alphanumeric keys.

28. The layout as claimed in claim 27, wherein the further extended Latin and Greek characters are assigned according to a mapping and wherein the mapping comprises language specific maps.

29. The layout as claimed in claim 28, wherein each language specific map comprises a 1-to-1 key mapping between a basic character and an associated extended Latin and Greek character for each language.

30. The layout as claimed in claim 29, wherein the mapping comprises pairings comprising at least one of:
q with ä, ə, ā and α, w with æ, ŵ, ě and ω, e with é, ę and ε, r with ë, ř, ŗ, ŕ and ρ, t with ê, ē, ţ, t', ṭ and τ, y with ü and υ, u with ú, ų, u' and θ, i with í, ị and ι, o with ó, o' and Greek letter o, 1 with ö, ō and ε, 2 with ô, ǒ and Greek letter ό, 3 with ï, ū and Greek letter ί, a with á, ą and α, s with ş, š, ś, ŝ and σ, d with à, d', đ and δ, f with è, ė and φ, g with ğ, ġ, ĝ, ǵ and γ, h with û, ū, ħ, ĥ and η, j with ù, ĵ, ų, ű and ξ, k with ì, ķ, ł and κ, l with ò, l', !, ḷ and λ, 4 with ø, ő and ή, 5 with î, ĭ and ύ, 6 with ÿ, ŭ and ϋ, z with â, ž, ż, ς and ζ, x with å, ź, ă, ǎ and χ, c with ç, č, ċ, ĉ, ḍ and ΐ, v with ã, ý, ć and ψ, b with ß, ỳ and β, n with ñ, ň, ń, ŋ, ŋ and Greek letter ν, m with µ, p with õ, ί, ẃ and π, 7 with ı, İ, ẁ, ü and Greek letter ι, 8 with œ, ŷ, ŭ, § and ώ, and 9 with ij, ẅ, ṵ, ΐ and ΰ.

31. The layout as claimed in claim 1, wherein a right hand edge of the numeric keypad is linear and is bordered by a column of function keys that comprises, in order from top to bottom: esc, delete right, delete left with tab (tabulate) as an alternative function, return with tab (tabulate) as an alternative function, shift and control functions.

32. The layout as claimed in claim 1, wherein a left hand edge of the alphabetical character typing zone is bordered by a column of function keys that comprises, in order from top to bottom: esc, delete right, delete left with tab (tabulate) as an alternative function, return with tab (tabulate) as an alternative function, shift and control functions.

33. The layout as claimed in claim 1, wherein the alphabetical character typing zone, numeric keypad and right-hand side function zone are differently colored.

\* \* \* \* \*